United States Patent [19]

Gass

[11] Patent Number: 5,789,920
[45] Date of Patent: Aug. 4, 1998

[54] POSITION SENSOR HOUSING HAVING DUROPLASTIC MOLDING COMPOUND AND THERMOPLASTIC MOLDING COMPOUND

[75] Inventor: Ernst Gass, Stuttgart, Germany

[73] Assignee: Gebhard Balluff GmbH & Co., Neuhassen/Fildern, Germany

[21] Appl. No.: 630,882

[22] Filed: Apr. 2, 1996

[30] Foreign Application Priority Data

Dec. 1, 1995 [DE] Germany .......... 195 44 815.4

[51] Int. Cl.[6] .......... G01R 33/00; G01D 11/24
[52] U.S. Cl. .......... 324/260; 324/207.15; 324/207.23; 324/207.24; 324/207.25; 324/258; 324/262; 336/92; 336/96
[58] Field of Search .......... 324/207.15, 207.16, 324/207.25, 207.22, 163, 166, 173, 260, 261, 262, 207.23, 207.24, 207.26; 29/592.1, 602.1; 336/96, 90, 92, 94; 439/449

[56] References Cited

U.S. PATENT DOCUMENTS 5,039,942  8/1991  Bushschmid et al. .......... 324/207.15
5,351,388  10/1994  Van Den Berg et al. .......... 324/207.15
5,563,510  10/1996  Gorrell et al. .......... 324/207.15

FOREIGN PATENT DOCUMENTS 195 04 608.0  2/1995  Germany .

OTHER PUBLICATIONS

"Cylinder Piston Indicators" Pepperl + Fuchs, 1994.

*Primary Examiner*—Sandra L. O'Shea
*Assistant Examiner*—Jay M. Patidar
*Attorney, Agent, or Firm*—Collard & Roe, P.C.

[57] ABSTRACT

A sensor and process for manufacturing same having an electrical circuit arranged on a carrier which is connected to an electrical connector and a sensor element. The carrier is disposed within a housing having one opening for the connector element and another opening for the sensor element. The sensor element and a first part of the carrier with the electrical circuit are embedded in a duroplastic molding compound. A second part of the carrier with the electrical circuit and the electrical connector are enclosed by a thermoplastic molding compound. A seal is arranged adjacent an intermediate space between the duroplastic molding compound and the housing.

18 Claims, 2 Drawing Sheets

POSITION SENSOR HOUSING HAVING DUROPLASTIC MOLDING COMPOUND AND THERMOPLASTIC MOLDING COMPOUND

BACKGROUND OF THE INVENTION

1. Field of the Invention

The invention relates to a sensor having an electrical circuit arranged on a circuit board which is connected to an electrical connector and a sensor element. The circuit board is disposed within a housing which has one opening for the connector and another opening for the sensor element.

2. The Prior Art

Previously, sensors have been manufactured with the electrical circuit and the circuit board inserted in the housing and cast in synthetic resin from the side of the connector. For casting in synthetic resin, the components of the electrical circuit have to be coated in order to account for problems with thermal expansion. This is because the thermal expansion of synthetic resin does not correspond with the thermal expansion of the components and the circuit board or the thermal expansion of the housing. Furthermore, when casting the sensor elements on the circuit board, it is necessary to use a beaker to form a front cover for the sensor element. The beaker then has to be sealed against the housing in order to embed the entire circuit board within the housing in synthetic resin. Moreover, during casting of the sensors there is always the problem that inclusions of air are formed, which impair the long-term functional efficiency of the sensor.

In order to eliminate these drawbacks, a position sensor and a process for its manufacture are known from German patent application P 195 04 608.0, which is not an earlier publication. The sensor has an electrical circuit, arranged on a circuit board, which is connected to an electrical connector and a sensor element. The circuit board is disposed within the interior space of a housing which includes one opening for the connector and another opening for the sensor element. The intermediate spaces between the housing, the circuit board and the electrical circuit, as well as the intermediate spaces between the housing and the connector and between the housing and the sensor element are filled with a duroplastic molding compound.

The position sensor is manufactured by first joining a circuit board having an electrical circuit arranged thereon, with a sensor element and a connector. Subsequently, the circuit board with the sensor element and the connector is placed within a housing. A duroplastic molding compound is then injected into the following areas: the intermediate spaces between the housing, the circuit board and the electrical circuit; the intermediate spaces between the housing and the connector; and the intermediate spaces between the housing and the sensor element.

The drawback with the prior art sensor is that the duroplastic molding compound, which is directly injected into the housing, (which in most cases is metallic) becomes detached from the housing in the course of time, for example, due to thermal stresses. The consequence thereof is that the entire sensor is no longer tightly sealed, and thus moisture can form in the interior of the housing due to penetration of water. As a result, the function of the sensor can be impaired, for example by creep currents and the like.

SUMMARY OF THE INVENTION

It is therefore an object of the present invention to overcome the drawbacks of the prior art and to provide an enhanced sensor of the type specified above, whereby the sensor can be readily manufactured with a superior hermetic seal at favorable cost.

These and other related objects are achieved according to the invention by a sensor including a circuit board having an electric sensor circuit disposed thereon and including a first part and a second part. A sensor element is coupled to the first part and an electrical connector is coupled to the second part. The housing has a hollow interior for accommodating the circuit board, a first opening for the sensor element and a second opening for the connector. A duroplastic molding compound encases the sensor element and the first part of the circuit board. A thermoplastic molding compound encases the electrical connector and the second part of the circuit board. A seal is disposed in an intermediate space between the duroplastic molding compound and the housing, adjacent to the first opening.

The structure of the sensor has the great advantage that it is hermetically sealed by the seal on the sensor side and it is sealed by the thermoplastic molding compound on the connection side. It is particularly advantageous, for example, that thermal expansion of the sensor will not lead to loosening of the sensor. This is because the seal, which is movably arranged between the duroplastic molding compound and the housing of the sensor, will always optimally seal on the sensor side if thermal expansion of the position sensor occurs, even in the presence of different thermal expansion between the housing and the duroplastic molding compound.

The duroplastic molding compound is contiguous with and connected to the thermoplastic molding compound. In this way, hollow spaces are not formed in the interior of the housing. The sensor element is rigidly joined to the first part of the circuit board to form a unitary structure which is encased as a whole by the duroplastic molding compound. The circuit board and the sensor element are preferably connected to each other by a soldered joint between the contacts of the sensor element and the contact surface of the circuit board.

In order to permit a particularly good hermetic embedding of the sensor element and the electrical circuit arranged on the first part of the carrier, the first part is devoid of surface-mounted components and surface-mounted conductive leads where the duroplastic molding compound ends opposite the sensor element. In this zone, all conductive leads are arranged in the interior of the carrier. The conductive leads are electrically connected, within the duroplastic molding compound, to the electrical circuit embedded in the duroplastic molding compound, for example, by connection elements extending through the circuit board. Furthermore, for installation purposes, it is advantageous with respect to the hermetic seal that the connector is rigidly joined to the second part of the circuit board to form a unitary structure which is embedded as a whole within the thermoplastic molding compound.

Preferably, the duroplastic molding compound is used not only to encase the first part of the carrier and the printed circuit, but also to form a covering on a front side of said sensor element, so that the sensor element is enclosed by the duroplastic molding compound on all sides. Due to the particularly high thermal stability of the duroplastic molding compound, it is possible to use the sensor under all sorts of operating conditions, even under extreme operating conditions, for example, near machine tools from which hot, glowing chips are ejected.

Moreover, such arrangement of the duroplastic molding compound also enhances the electric properties (permeability, dielectricity constant, conductivity). Furthermore, aging problems that may be caused by hardening, which pose basic problems with other known casting compounds, are avoided. Finally, the duroplastic molding compound permits filling of the entire coil core space without air bubbles and covers for the coil core space, for example plastic caps, which are commonly used with known arrangements, can be dispensed with.

The connection element can be designed in all sorts of different ways, for example in the form of a plug element. In this case, the plug element preferably has a plastic inside part supporting the prongs of the plug. To provide an indicator, for example an LED, for sensors which indicate a condition, the plastic inside part is transparent, so that the light from the LED can be transmitted to the outside via the plastic inside part. Advantageously, breakthroughs are provided, for example, in an outer cover of the plug element or in the housing of the sensor, through which the light emitted by the LED is transmitted to the outside.

Preferably, the plastic inside part is designed to form a receptacle for the LED, so that the latter is protected by such receptacle. The plug element, particularly its plastic inside part, can be connected with the circuit board in various ways. Preferably, the connection pins of the plastic inside part are directly connected to the conductive leads of the circuit board, e.g. by soldering. The plug element and the second part of the circuit board connected therewith are arranged in the housing of the sensor in such a way that a hermetic seal is also obtained on the plug side. The plug element is connected with the housing preferably by the thermoplastic molding compound, whereby the connection pins, too, are directly embedded in the thermoplastic molding compound together with the circuit board.

Alternative to the plug element, another embodiment of the connection element comprises a cable that is coated with the thermoplastic molding compound by injection molding. In this case, the electrical circuit is directly connected to individual leads or wires of the connection cable, whereby the thermoplastic molding compound serves the purpose of fixing the connection cable relative to the circuit board or relative to the housing.

Therefore, provision is made for the thermoplastic molding compound to surround the cable at least partially. It is particularly advantageous that the thermoplastic molding compound is cross-linked to the cable to form a moisture-tight bond. In this way, moisture is effectively prevented from getting into the housing of the sensor via the cable connection.

To indicate a condition of the electrical circuit with LED's, the thermoplastic molding compound covering the light-emitting diode is permeable to light at least in part. Basically, the thermoplastic molding compound secures the connection element and connects the cable, the circuit board and the housing to one another. However, it is especially advantageous if the molding compound forms a body for substantially sealing the opening in the housing for the connection element. In this way it is possible to obtain a particularly tight, especially moisture-tight seal of the housing on the side of the connection element.

In order to form a particularly stable connection between the connection element and the housing, especially in a case where the connection element is a cable, openings are provided on the connection side of the housing for effective relief of tensile forces. These openings are filled with thermoplastic molding compound to form a solid and tight connection between the connection element and the housing. At the same time, such openings may advantageously provide a path for the light emitted by the light-emitting diode as described above. In this case, the thermoplastic molding compound is light permeable at least within the zone of the openings.

With respect to the seal, basically any type of a movably-arranged seal can be used between the duroplastic molding compound and the housing. Preferably, however, the seal is an O-ring seal which has a good sealing effect, can be easily mounted and is relatively favorably priced.

In order to permit an exact alignment, particularly of the sensor element in the housing, and to obtain an optimal hermetic seal, the sensor element and the electric sensor circuit encased within the duroplastic molding compound and the electrical connector and the second part encased in the thermoplastic molding compound form a unitary structure which is precisely positioned within the hollow interior of the housing.

The process for manufacturing a sensor system includes the steps of forming an electric sensor circuit on a circuit board having a first part connected to a sensor element and a second part connected to an electrical connector. The sensor element and the first part of the circuit board are encased with a duroplastic molding compound. The circuit board is inserted into a hollow interior of a housing and a seal is formed across an intermediate space between the duroplastic molding compound and an interior of the housing. A thermoplastic molding compound is injection molded into intermediate spaces between the second part of the circuit board and the housing and the electrical connector and the housing.

To obtain a hermetic seal and to permit an exact positioning, the sensor element embedded in the duroplastic molding compound together with the first part of the circuit board and the seal are preferably jointly fixed with the second part of the circuit board in defined positions in the interior of the housing, prior to injecting the thermoplastic molding compound.

In this connection, the sensor element embedded in the duroplastic molding compound together with the first part of the circuit board, the seal, the second part of the circuit board and the connection element preferably form a unitary structure, which is inserted in the interior of the housing and positioned in the latter.

The step of encasing the sensor element comprises simultaneously encasing a plurality of sensor elements and first parts with duroplastic molding compound.

BRIEF DESCRIPTION OF THE DRAWINGS

Other objects and features of the present invention will become apparent from the following detailed description considered in connection with the accompanying drawings. It is to be understood, however, that the drawings are designed as an illustration only and not as a definition of the limits of the invention.

In the drawings, wherein similar reference characters denote similar elements throughout the several views.

DETAILED DESCRIPTION OF THE PREFERRED EMBODIMENT

Figure 1:
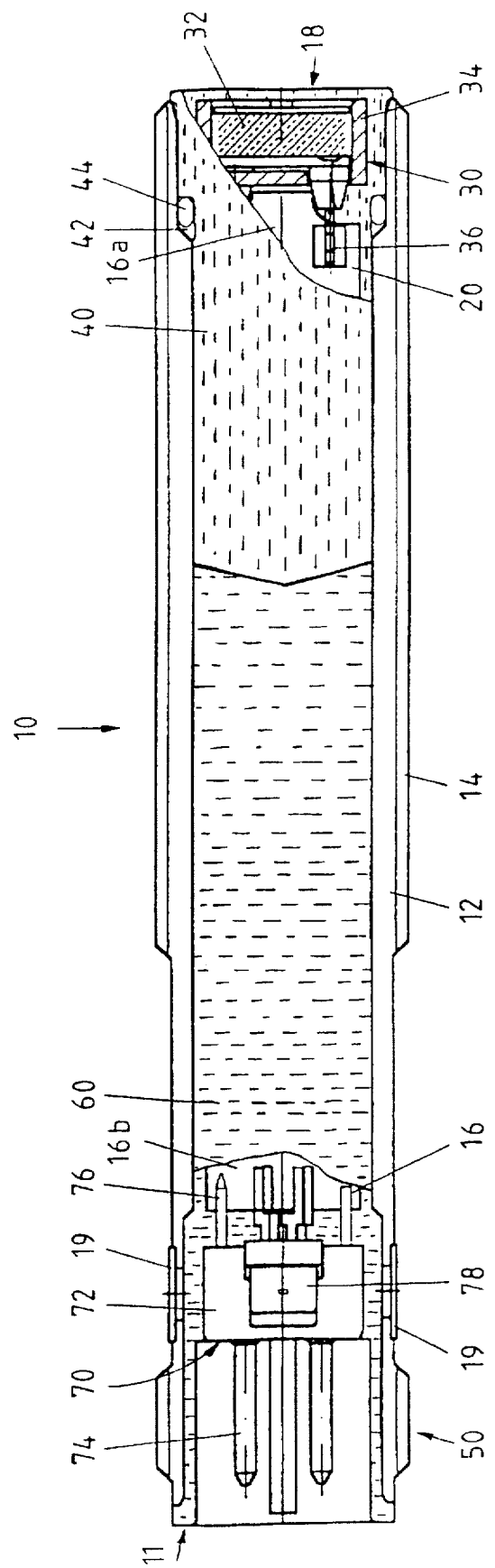
FIG. 1 is a partial, cross-sectional view of a sensor according to the invention.

Referring now in detail to the drawings and, in particular, FIG. 1, there is shown an electrical sensor 10 comprising a housing 12, which is preferably designed as a tube with an outside thread 14 and a carrier 16, which can be inserted in housing 12. Carrier 16 is, for example, a circuit board, on which electric components are arranged (not shown) in a manner known per se for forming an electrical circuit. A sensor of this type is disclosed in German Patent Application P 195 04 608.0, the contents of which are incorporated herein by reference thereto. Carrier board 16 extends in the direction of a longitudinal axis of housing 12, and perpendicular to the longitudinal axis substantially across an inside diameter of housing 12.

A sensor element, denoted as a whole by sensor element 30, is arranged on a front end 20 of circuit board 16, whereby the sensor element 30 preferably has a coil 32, arranged in a dish-shaped core 34, which is open on the front side. Sensor element 30 is connected to conductive leads of circuit board 16 via electrical connection pins 36 of a coil body supporting coil 32. In this connection, sensor element 30 and a first part 16a of the carrier are embedded with at least part of the electric/electronic circuit in a duroplastic molding compound 40. However, preferably, all components, for example resistors, coils, capacitors, IC's of the electric/electronic circuit are embedded in the particularly resistant and hermetic sealing duroplastic molding compound 40 and, in this way, effectively protected against ambient influences.

Figure 2:
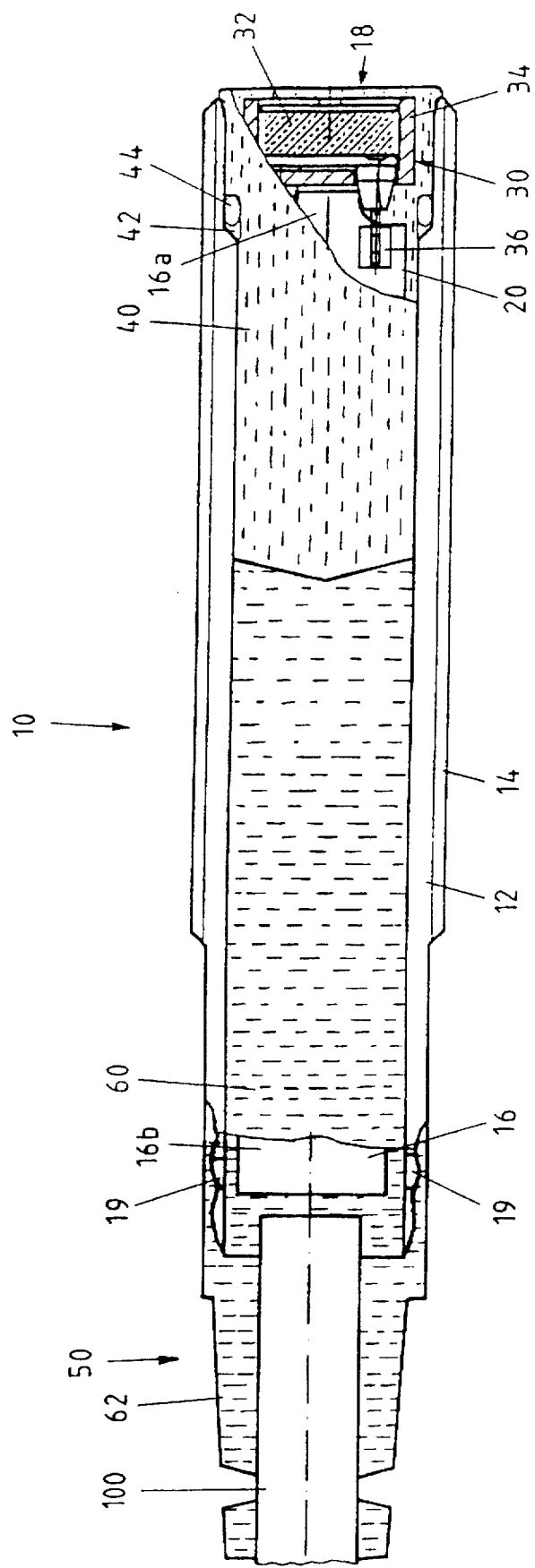
FIG. 2 is a partial, cross-sectional view of a second embodiment of a sensor according to the invention.

As shown in FIGS. 1 and 2, first part 16a of carrier 16, which is embedded in duroplastic molding compound 40, comprises about one third of the total length of carrier 16. It is understood that this is not necessarily required, and that more or less than one third of the length of carrier 16 may be embedded in duroplastic molding compound 40, depending on the expanse of the components forming the electrical circuit on carrier 16. In order to obtain a particularly good hermetic sealing of first part 16a of carrier 16, the side of first part 16a remote from sensor element 30 ends in a zone of carrier 16 in which no components are arranged on the surface at all, including conductive leads. Even the smallest interference with the tightness, which for example, can be caused by conductive leads are avoided in this way. In the zone of the carrier that is free of components and conductive leads, all conductive leads are arranged in the interior of carrier 16. The conductive leads are electrically connected (not shown) to the conductive leads embedded in duroplastic molding compound 40, as with the conductive leads enclosed by thermoplastic molding compound 60, via connection elements penetrating across carrier board 16 at least partially.

Adjacent to an opening 18 for sensor element 30 in housing 12 of sensor 10, an O-ring seal 44 is movably arranged in an intermediate space 42. Seal 44 produces a hermetic seal of the front part of the sensor. O-ring seal 44, movably arranged in housing 12, assures that a thermal expansion of housing 12 and/or carrier board 16, particularly a thermal expansion of housing 12, which is made of metal in most cases, which deviates from the thermal expansion of carrier board 16, which in most cases is made of epoxy resin, will not lead to any loosening of sensor 10 on the sensor side. Even under different temperature conditions, or under different mechanical stresses acting on sensor 10, O-ring seal 44 always assures optimal sealing and thus a hermetically optimal seal of sensor 10.

At the rear end 11 of sensor 10 opposite opening 18, provision is made for an electrical connector 50 which, for example, may be designed as a plug element 70, as seen in FIG. 1. Plug element 70 comprises a transparent plastic receptacle 72, which includes plug contact pins 74 on the connection side and connection pins 76 on the side facing carrier 16. Pins 76 are connected to the conductive leads (not shown) arranged on circuit board 16, for example, by soldering.

A light-emitting diode (LED) 78 is disposed in transparent plastic receptacle 72. LED 78 is connected to conductive leads on carrier board 16 to indicate the operating condition of sensor 10. So that the light emitted by light-emitting diode 78 can be seen from the outside, apertures 19 are arranged in housing 12 surrounding the LED. Pairs of apertures 19 diametrically oppose one another and are preferably evenly distributed over the circumference of housing 12.

A second part 16b of carrier 16 and electrical connection element 50 are enclosed by a thermoplastic molding compound 60. In this connection, thermoplastic molding compound 60 directly abuts the duroplastic molding compound 40 and is joined with the latter.

As can be seen in FIG. 2, a connection cable 100 has individual leads or wires which are directly connected to corresponding conductive leads of carrier 16 (not shown) via soldered connections. Connection cable 100 is provided in place of plug element 70 at the connection side of sensor 10. Connection cable 100 has the thermoplastic molding compound injected around it, so that thermoplastic molding compound 60 encloses cable 100 at least partially. By injecting thermoplastic molding compound 60 around connection cable 100, a body 62 is formed from thermoplastic molding compound 60 which cross-links with the thermoplastic coating of connection cable 100. In this manner, a particularly moisture-tight connection between connection cable 100 and body 62 is obtained. Furthermore, the opening of housing 12 for connection element 50 is sealed moisture tight by body 62.

Thermoplastic molding compound 60, which encloses connection cable 100, also encloses second part 16b of carrier 16 so that hermetic sealing is assured in this way also on the connection side. As mentioned above, provision is made in housing 12 for openings 19 so that the light emitted by an LED is visible from the outside. Openings 19 are penetrated by thermoplastic molding compound 60 which contributes to a particularly solid and tight connection between connection cable 100 and housing 12 of sensor 10, and thus also for relieving connection cable 100 from tensile stress.

In order to permit an optimal hermetic sealing and to precisely arrange the sensor element in housing 12 in a reproducible way, the unit consisting of sensor element 30, embedded in duroplastic molding compound 40, first part 16a, second part 16b, and connection element 50 embedded in thermoplastic molding compound 60, is exactly positioned in the interior space of housing 12. Such positioning is advantageously achieved through O-ring seal 44, with, for example, positioning elements (not shown), such elements being arranged between carrier 16 and the interior of the housing.

Sensor 10 can be manufactured in a particularly simple way by first embedding sensor element 30 and first part 16a of carrier 16 with the electrical circuit outside of housing 12 of sensor 10 in a duroplastic molding compound 40. This occurs by simultaneously encasing a plurality of first parts 16a of carrier 16 with the electrical circuits together with sensor elements 30. The resulting unit is inserted into housing 12. Seal 44 is arranged in an intermediate space 42 between duroplastic molding compound 40 and the interior of housing 12. Subsequently the intermediate spaces between second part 16b of carrier 16 and housing 12, as well as between connection element 50 and the housing are filled with a thermoplastic molding compound 60 by injection molding. In this connection, the sensor element 30, which was embedded in duroplastic molding compound 40 together with first part 16a of the carrier, is fixed in the interior of the housing in defined positions relative to housing 12 jointly with second part 16b of carrier 16 and connection element 50 between duroplastic molding compound 40 and the interior of housing 12, for injection of thermoplastic molding compound 60.

In this connection, sensor element 30 embedded together with first part 16a of carrier 16 in duroplastic molding compound 40, with the inclusion of seal 44 between duroplastic molding compound 40 and the interior of housing 12, second part 16b and connection element 50 jointly form a unitary structure which is inserted in the interior of the housing and positioned in the latter.

Accordingly, while only several embodiments of the present invention have been shown and described, it is obvious that many changes and modifications may be made thereunto without departing from the spirit and scope of the invention.

What is claimed is:

1. A sensor comprising:
   a circuit board having an electric sensor circuit disposed thereon, said circuit board including a first part and a second part;
   a sensor element coupled to said first part and an electrical connector coupled to said second part;
   a housing having a hollow interior for accommodating said circuit board, a first opening for said sensor element and a second opening for said connector;
   a duroplastic molding compound encasing said sensor element and said first part of said circuit board;
   a thermoplastic molding compound encasing said electrical connector and said second part of said circuit board; and
   a seal disposed in an intermediate space between said duroplastic molding compound and said housing, adjacent to the first opening.

2. The sensor according to claim 1, wherein said duroplastic molding compound is contiguous with and connected to said thermoplastic molding compound.

3. The sensor according to claim 1, wherein said sensor element is rigidly joined to said first part of said circuit board to form a unitary structure which is encased as a whole by said duroplastic molding compound.

4. The sensor according to claim 3, wherein said first part is devoid of surface-mounted components and surface-mounted conductive leads where said duroplastic molding compound ends opposite said sensor element.

5. The sensor according to claim 1, wherein said connector is rigidly joined to said second part of said circuit board to form a unitary structure which is encased as a whole by said thermoplastic molding compound.

6. The sensor according to claim 1, wherein said duroplastic molding compound forms a covering on a front side of said sensor element.

7. The sensor according to claim 1, wherein said housing includes openings near said electrical connector which are filled with said thermoplastic molding compound to form a solid and tight connection between said electrical connector and said housing.

8. The sensor according to claim 1, wherein said electrical connector comprises a plug.

9. The sensor according to claim 8, wherein said plug includes a transparent plastic receptacle for a light-emitting diode (LED).

10. The sensor according to claim 9, wherein said thermoplastic molding compound connects said plug to said housing.

11. The sensor according to claim 10, wherein said thermoplastic molding compound is translucent at least in a zone around said receptacle for transmitting light from the LED.

12. The sensor according to claim 1, wherein said electrical connector comprises a cable coated with said thermoplastic molding compound by injection molding.

13. The sensor according to claim 12, wherein said thermoplastic molding compound encloses said cable at least partially.

14. The sensor according to claim 12, wherein said thermoplastic molding compound is cross-linked to said cable to form a moisture-tight bond.

15. The sensor according to claim 12, wherein said thermoplastic molding compound forms a body which seals said second opening of said housing to form a moisture-tight seal.

16. The sensor according to claim 1, wherein said seal is an O-ring seal.

17. The sensor according to claim 1, wherein all components of said electric sensor circuit are embedded in said duroplastic molding compound.

18. The sensor according to claim 17, wherein said sensor element and said electric sensor circuit encased within said duroplastic molding compound and said electrical connector and said second part encased in said thermoplastic molding compound form a unitary structure which is precisely positioned within the hollow interior of said housing.

* * * * *